United States Patent [19]

Yoshida et al.

[11] Patent Number: 4,901,281
[45] Date of Patent: Feb. 13, 1990

[54] SEMICONDUCTOR MEMORY DEVICE HAVING TWO COLUMN TRANSFER GATE TRANSISTOR GROUPS INDEPENDENTLY PROVIDED FOR A SENSE AMPLIFIER AND A PROGRAMMED CIRCUIT

[75] Inventor: Masanobu Yoshida, Kawaguchi; Mitsuo Heguchi, Tokyo, both of Japan

[73] Assignee: Fujitsu Limited, Kawasaki, Japan

[21] Appl. No.: 353,163

[22] Filed: May 12, 1989

Related U.S. Application Data

[63] Continuation of Ser. No. 262,094, Oct. 19, 1988, abandoned, which is a continuation of Ser. No. 895,106, Aug. 11, 1986, abandoned.

[30] Foreign Application Priority Data

Aug. 16, 1985 [JP] Japan .................................. 60-179442

[51] Int. Cl.⁴ ........................ G11C 7/00; G11C 11/40
[52] U.S. Cl. ........................... 365/189.05; 365/230.08; 365/182
[58] Field of Search ..................... 365/189.01, 189.05, 365/182, 185, 230.08

[56] References Cited

U.S. PATENT DOCUMENTS

| | | | |
|---|---|---|---|
| 4,319,341 | 3/1982 | Fukushima et al. | 365/94 |
| 4,367,538 | 1/1983 | Shimada | 365/104 X |
| 4,432,070 | 2/1984 | Moss | 365/96 |
| 4,435,789 | 3/1984 | Gietel et al. | 365/104 X |
| 4,481,609 | 11/1984 | Higuchi et al. | 365/230 X |
| 4,527,256 | 7/1985 | Giebel | 365/189 X |
| 4,535,259 | 8/1985 | Smarandoiv et al. | 365/104 X |
| 4,558,434 | 12/1985 | Baba et al. | 365/189 |
| 4,616,339 | 10/1986 | Cuppens et al. | 365/189 X |
| 4,630,085 | 12/1986 | Koyama | 365/185 X |
| 4,758,987 | 7/1988 | Sakui | 365/189 |
| 4,769,789 | 9/1988 | Noguchi et al. | 365/189 |

FOREIGN PATENT DOCUMENTS 0050005 4/1982 European Pat. Off. .
2413794 4/1983 France .

OTHER PUBLICATIONS

IBM Technical Disclosure Bulletin, vol. 18, No. 6, Nov. 1975.
LSI Memories, 2311 Fujitsu Scientific & Technical Journal, 21 (1985), Jul. No. 3, Kawasaki, Japan, pp. 337-369.

Primary Examiner—James W. Moffitt
Assistant Examiner—Alyssa H. Bowler
Attorney, Agent, or Firm—Armstrong, Nikaido Marmelstein, Kubovcik & Murray

[57] ABSTRACT

A semiconductor memory device, including a plurality of programmable read only memory cells arranged at intersection points of a matrix formed by a plurality of word-lines and bit-lines crossing each other, independently having first column transfer gate transistors located between a programming circuit and the bit-lines to transfer a programming data signal from the programming circuit to a selected memory cell located on one of the bit-lines when the memory device is in a programming mode and second column transfer gate transistors located between a sense amplifier and the bit-lines to transfer a read out data signal from a selected memory cell located on one of the bit-lines to a sensing amplifier when the memory device is in a reading mode.

5 Claims, 6 Drawing Sheets

SEMICONDUCTOR MEMORY DEVICE HAVING TWO COLUMN TRANSFER GATE TRANSISTOR GROUPS INDEPENDENTLY PROVIDED FOR A SENSE AMPLIFIER AND A PROGRAMMED CIRCUIT

This application is a continuation of application Ser. No. 262,094 filed Oct. 19, 1988, which is a continuation of Ser. No. 895,106, filed 8/11/86, both now abandoned.

BACKGROUND OF THE INVENTION

The present invention relates to a semiconductor memory device including a plurality of programmable read only memory (PROM) cells arranged in a matrix of rows and columns, and it particularly relates to two column transfer gate transistor groups independently provided for a sense amplifier and a programming circuit of the memory device.

FIG. 1 is a schematic diagram of the prior art memory device showing a part related to the present invention. In FIG. 1, a reference symbol QM shows a plurality of PROM cells arranged at intersection points of a matrix formed by a plurality of word-lines $WL_0$ through $WL_m$ and bit-lines $BL_0$ through $BL_n$ crossed each other. When an address signal A comes into both of a column decoder 1 and a row decoder 2, the decoders 1 and 2 produce column selecting signals $Y_0$ through $Y_n$ and row selecting signals $X_0$ through $X_m$ respectively. Column transfer gate transistors $T_0$, $T_1$, and $T_n$ are connected to bit-lines $BL_0$, $BL_1$, and $BL_n$ respectively, and each column transfer gate transistor consists of a field effect transistor having a source connected to both of a sense amplifier 3 and a programming circuit 4, a drain connected to the bit-line $BL_0$, $BL_1$, or $BL_n$, and a gate connected to the column decoder 1 to receive the column selecting signal $Y_0$, $Y_1$, or $Y_n$. When the address signal A is applied to the memory device, one of the row selecting signals $X_0$ through $X_m$ is applied to one of the word-lines $W_L$ through $WL_m$, and one of the column selecting signals $Y_0$ through $Y_n$ is applied to a gate of one of the column transfer gate transistors $T_0$ through $T_n$.

When the memory device is in a state of programming a data signal given from the exterior of the memory device, the state will be called as "a programming mode" hereinafter, a PROM cell must be selected from the PROM cells arranged in the matrix, by both of a row selecting signal ($X_0$, $X_1$, or $X_m$) and a column selecting signal ($Y_0$, $Y_1$, or $Y_n$), and the programming circuit 4 is connected to the selected PROM cell by a selected column transfer gate transistor ($T_0$, $T_1$, or $T_n$ so that the data signal applied from the exterior of the memory device is transferred and programmed into the selected PROM cell.

When the memory device is in a state of reading a data signal stored in a selected PROM cell, the state will be called as "a reading mode" hereinafter, the PROM cell is selected the same of the above, and the sensing amplifier is connected to the selected PROM cell by a selected column transfer gate transistor ($T_0$, $T_1$, or $T_n$) so that the data signal stored in the selected PROM cell is read out and transferred to the sense amplifier 3 and amplified.

In FIG. 1, the source of every transfer gate transistor is connected to both of the sense amplifier 3 and the programming circuit 4. However, functionally, either of the sense amplifier 3 or the programming circuit 4 is selected by switching circuits, which are not depicted in FIG. 1, located in the sense amplifier 3 and the programming circuit 4 respectively and controlled by a read-write selecting signal 6 applied from the exterior of the memory device.

FIG. 2 is a schematic diagram of the prior art showing the relation between the column decoder 1 and the selected column transfer gate transistor $T_i$ (i indicates one of the numerals 0 through n). In FIG. 2, the same reference numeral or symbol as in FIG. 1 designates the same unit or part as in FIG. 1, and a metal oxide semiconductor (MOS) transistor is used for all transistors; wherein, a transistor having no mark is an n-channel enhancement type transistor, a transistor having a black dot is an n-channel depletion type transistor, and a transistor having an arrow mark is a p-channel type transistor. When the address signal A consisting of binary signals $a_i$, $a_j$, and $a_k$ are applied to a NAND gate 101 of the column decoder 1 so that the binary signals are all in a high (H) level, the output level of the NAND gate 101 becomes low (L), and a buffer inverter 102 of the column decoder 1 produces a column selecting signal $Y_i$ having an H level, so that a column transfer gate transistor $T_i$ becomes conductive. As a result, when the memory device is in the reading mode, the sensing amplifier 3 is connected to the selected PROM cell on a bit-line $BL_i$, and when the memory device is in the programming mode, the programming circuit 4 is connected to the selected PROM cell. A power supply voltage $V_{ppi}$ for the NAND gate 101 and the buffer inverter 102 is variable. When the memory device is in the programming mode, the power supply voltage $V_{ppi}$ becomes a high voltage (for example 21 volts (V)) so that the bit-line is held high with a high voltage (for example 15 V) for programming the data signal into the selected PROM cell. When the memory device is in the reading mode, the voltage $V_{ppi}$ is switched to a low voltage (for example 5 V).

Recently, a memory device is required to have a fast access time, particularly in the reading mode. However, in the prior art, there is a problem that the memory device cannot operate at high speed in the reading mode because the column transfer gate transistor is commonly used for programming and reading out the data signal. In FIG. 2, a large current is required to flow through the transistor $T_i$, in the programming mode, for programming the data signal into the selected PROM cell on the bit-line $BL_i$. Therefore, a channel width of the transistor $T_i$ must be large, which causes an increase in p-n junction capacitance formed between a substrate and a source or drain region of the transistor $T_i$. This large stray capacitance becomes a heavy load for the sensing amplifier 3 and the PROM cell, so that a data sensing speed obtained in the sense amplifier 3 becomes slow. Furthermore, large capacitance formed between the gate of $T_1$, $T_2$, or $T_n$ and its channel also becomes a heavy load for the column decoder 1, so that a rise-time and a fall-time of the column selecting signal ($Y_i$) are lengthened, which also slow the data access time. A memory device having the PROM cells is usually used in the reading mode, and it is not necessary for the speed of programming the data signal into the selected PROM cell to be high. Thus, the problem stated above is how to realize the fast access time in the reading mode. Increasing the sensitivity of the sense amplifier 3 could be considered for increasing the data reading speed; however, if the sensitivity increases, another problem occurs in that an error due to the noise occurs because the sense amplifier 3 becomes much too critical; such kind of the error cannot be allowed to occur in the memory device. Thus, in the art of designing and fabricating the memory device, a fast access time in the reading mode has been anxiously awaited.

SUMMARY OF THE INVENTION

An object of the present invention is to realize a faster access time of the memory device in the reading mode.

The object is achieved by providing two groups of column transfer gate transistors. One is a first group of first column transfer gate transistors for programming the data signals into the selected PROM cells, and the other is a second group of second column transfer gate transistors for reading the data signals from the PROM cells. The two groups are independently provided to the memory device.

DESCRIPTION OF THE PREFERRED EMBODIMENT

Figure 1:
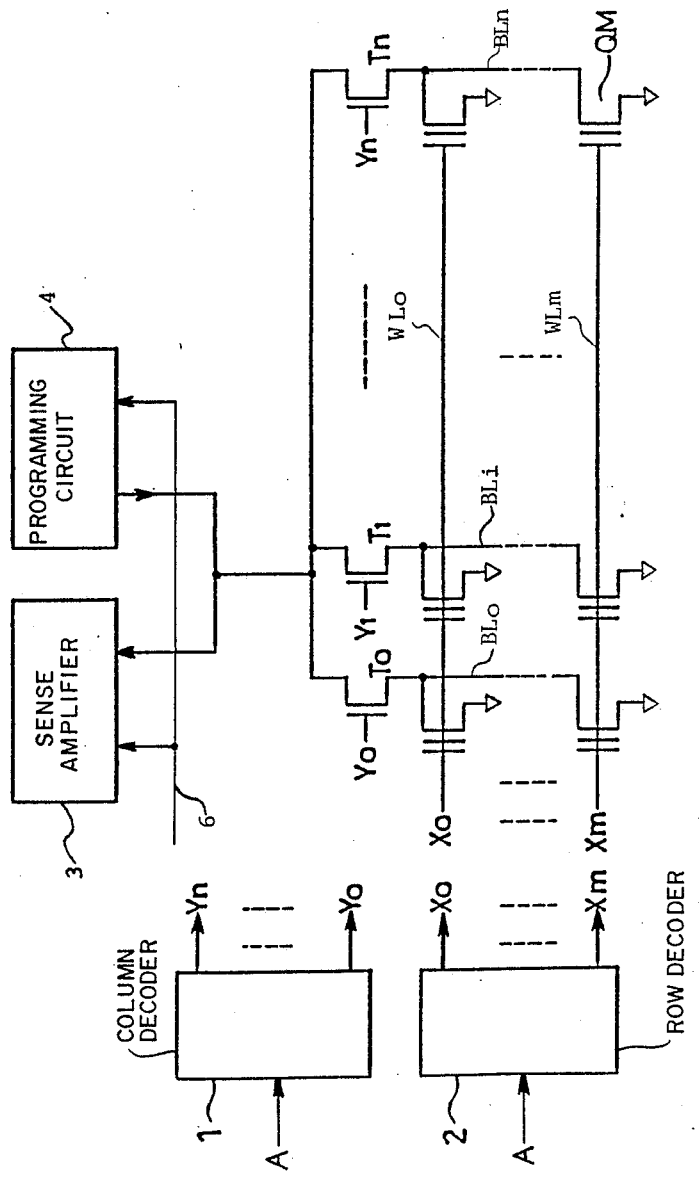
FIG. 1 is a schematic diagram of the prior art memory device.
Figure 3:
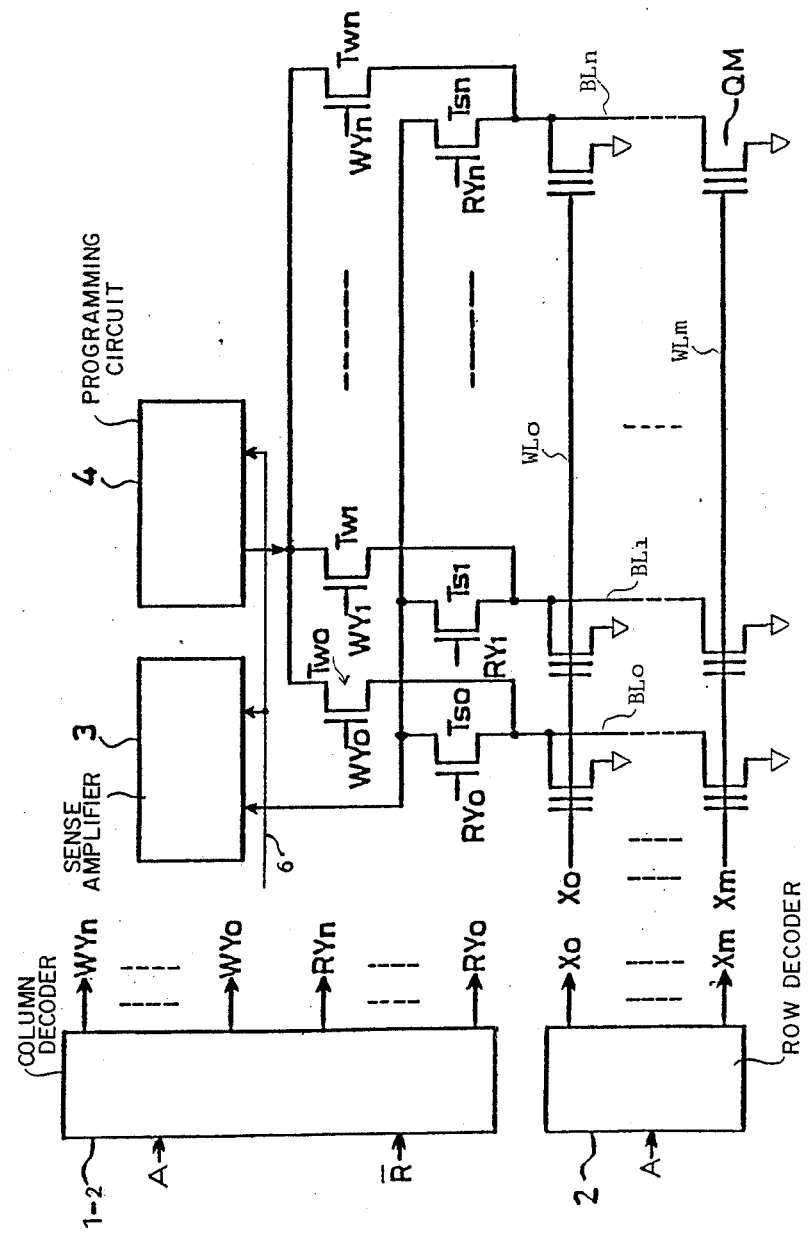
FIG. 3 is a schematic diagram of a memory device firstly embodying the present invention.

FIG. 3 is a schematic diagram of a memory device firstly embodying the present invention. In FIG. 3, the same reference numeral or symbol as in FIG. 1 designates the same element or unit as in FIG. 1. The point of the present invention is that the column transfer gate transistors in the prior art memory device shown in FIG. 1 is independently separated into two groups: a first group of first column transfer gate transistors $T_{W0}$ through $TW_n$ and a second group of second column transfer gate transistors $T_{S0}$ through $T_{Sn}$ as shown in FIG. 3. The first column transfer gate transistor $T_{W0}$, $T_{w1}$, or $T_{wn}$ is for transferring a data signal from the programming circuit 4 to the selected PROM cell on a bit-line $BL_0$, $BL_1$, or $BL_n$ in the programming mode, and the second column transfer gate transistor $T_{S0}$, $T_{S1}$, or $T_{Sn}$ is for reading out and transferring a data signal stored in a selected PROM cell on the bit-line $BL_0$, $BL_1$, or $BL_n$ using the sense amplifier 3 in the reading mode. The first column transfer gate transistors $T_{W0}$ through $TW_n$ and the second column transfer gate transistors $T_{S0}$ through $T_{Sn}$ are selected by a write column selecting signal $WY_0$, $WY_1$, or $WY_n$ and a read column selecting signals $RY_0$, $RY_1$, or $RY_n$ respectively. The write and read column selecting signals are provided in a column decoder 1-2.

Figure 2:
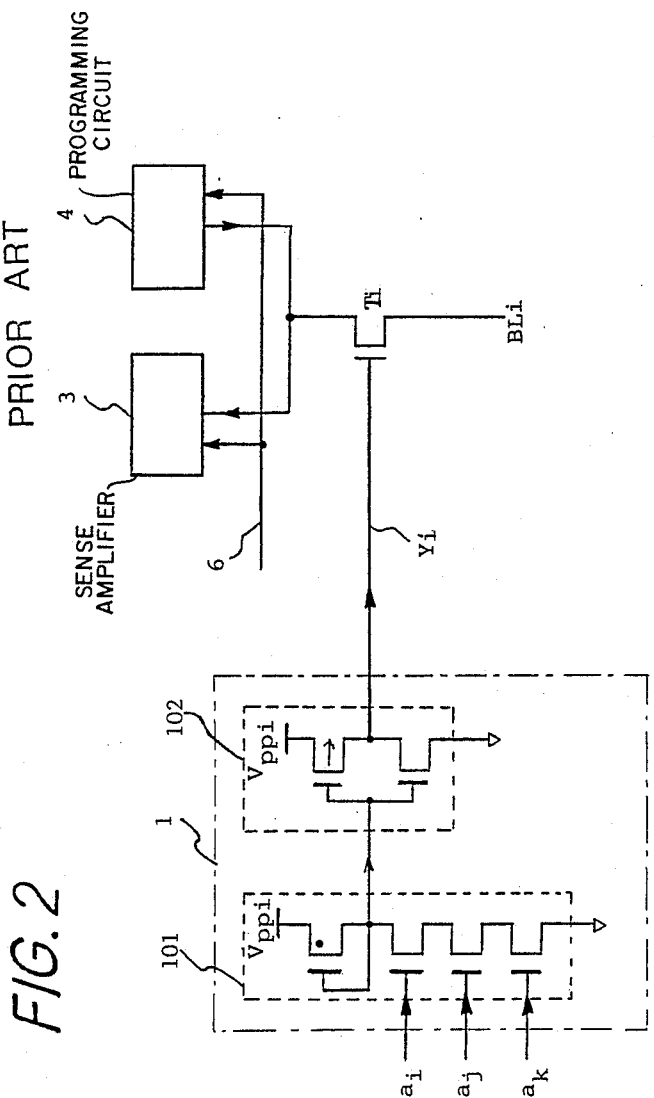
FIG. 2 is a schematic diagram showing a part relating to a column decoder and a column transfer gate transistor of the memory device.
Figure 4:
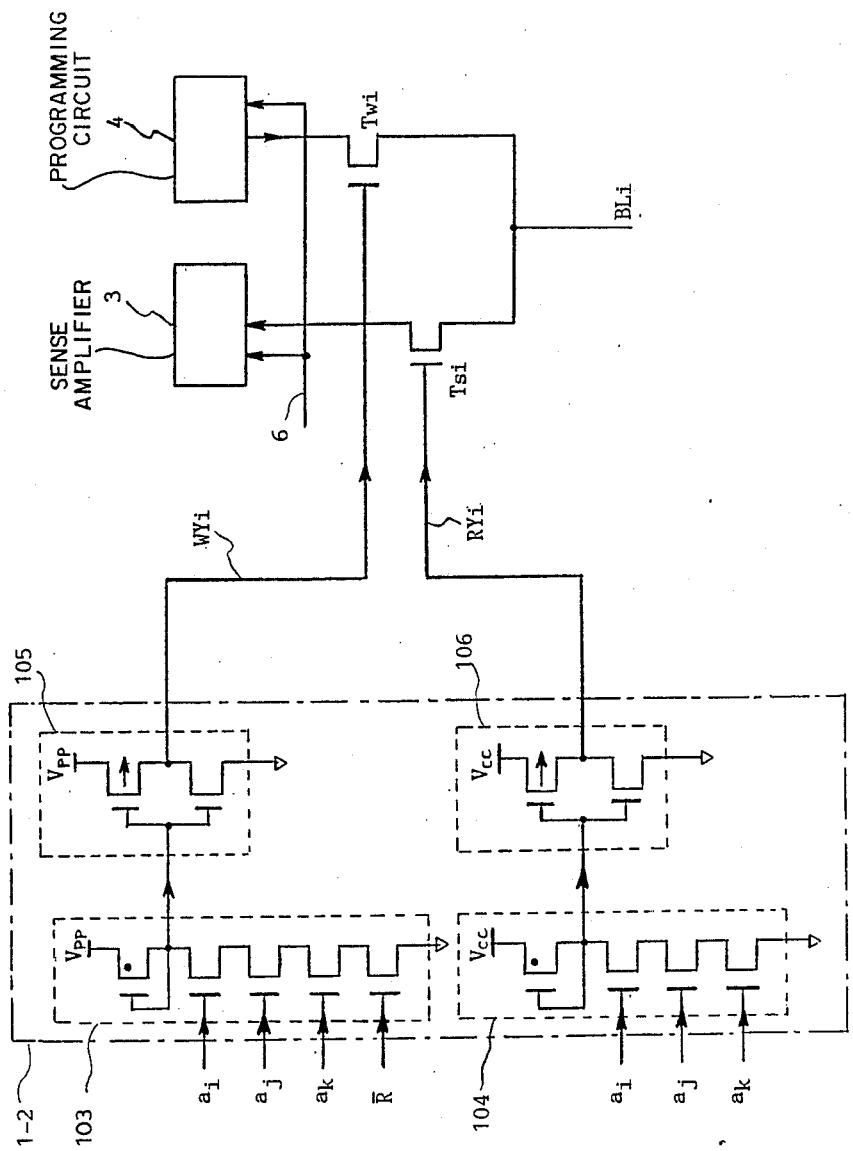
FIG. 4 is a schematic diagram showing a part relating to a column decoder and a column transfer gate transistor of the memory device firstly embodying the present invention.

FIG. 4 is a schematic diagram showing a part relating to the column decoder 1-2, a first column transfer gate transistor $T_{Wi}$, and a second column transfer gate transistor $T_{Si}$ of the memory device firstly embodying the present invention. In FIG. 4, the same reference numeral or symbol as in FIG. 3 designates the same unit or part as in FIG. 3, all transistors comprise the MOS transistors and their symbols such as the black dot and the arrow indicate the same kinds of the transistors as in FIG. 2.

In this first embodiment, the column decoder 1-2 has two NAND gates 103 and 104 and two buffer inverters 105 and 106. The NAND gate 103 and the buffer inverter 105 are for the programming mode, and the NAND gate 104 and the buffer inverter 106 are for the reading mode. Therefore, a high power supply voltage $V_{pp}$ (21V for example) is applied to both of the NAND gate 103 and the buffer inverter 105 and a low power supply voltage $V_{cc}$ (5 V for example) is applied to both of the NAND gate 104 and the buffer inverter 106. The address signal A consisting of binary signals $a_i$, $a_j$, and $a_k$ is applied to both of the NAND gates 103 and 104. An inverted reading signal $\overline{R}$ is applied to the NAND gate 103 so that the level of the inverted reading signal $\overline{R}$ is L in the reading mode and an H in the programming mode. When the address designated by the address signal A is coincides with that of a selecting PROM cell on the bit-line $BL_i$, the NAND gate 104 makes flow a current. Therefore, the output of the NAND gate 104 becomes an L level, so that the output of the buffer inverter 106, which is equal to a read column selecting signal $RY_i$, becomes an H level, which makes the second transfer gate transistor $T_{Si}$ conductive. In the above condition, when the memory device is in the reading mode, the NAND gate 103 cannot make flow its current because the level of the inverted reading signal $\overline{R}$ becomes L, and the read-write selecting signal 6 selects the sense amplifier to operate. Accordingly, the data signal stored in the selected PROM cell is read out and amplified. When the address signal A designates the address of the selecting PROM cell and the memory device is in the programming mode, the NAND gate 103 makes flow a current because the level of the inverted reading signal $\overline{R}$ becomes H. Therefore, the output of the buffer inverter 105, which is equal to a write column selecting signal $WY_i$, outputs an H level, so that the first column transfer gate transistor $T_{Wi}$ becomes conductive. In this condition, the NAND gate 104 and the second column transfer gate transistor $T_{Si}$ also operate as stated above. However, only the programming circuit 4 operates because of the read-write selecting signal 6. In the above, even though the currents ineffectively flow through the NAND gate 104, the buffer inverter 106, and the second column transfer gate transistor $T_{Si}$ wasting the power consumption of the memory device, the ineffective power consumption does not make much difference to the power consumption in the all memory device. Because the first column transfer gate transistor $T_{Wi}$ wastes more current than the above ineffective currents in the programming mode.

Thus, in the first embodiment of the present invention, only the second column transfer gate transistor $T_{Si}$ operates and the first column transfer gate transistor $T_{Wi}$ does not operate when the memory device is in the reading mode.

Figure 5:
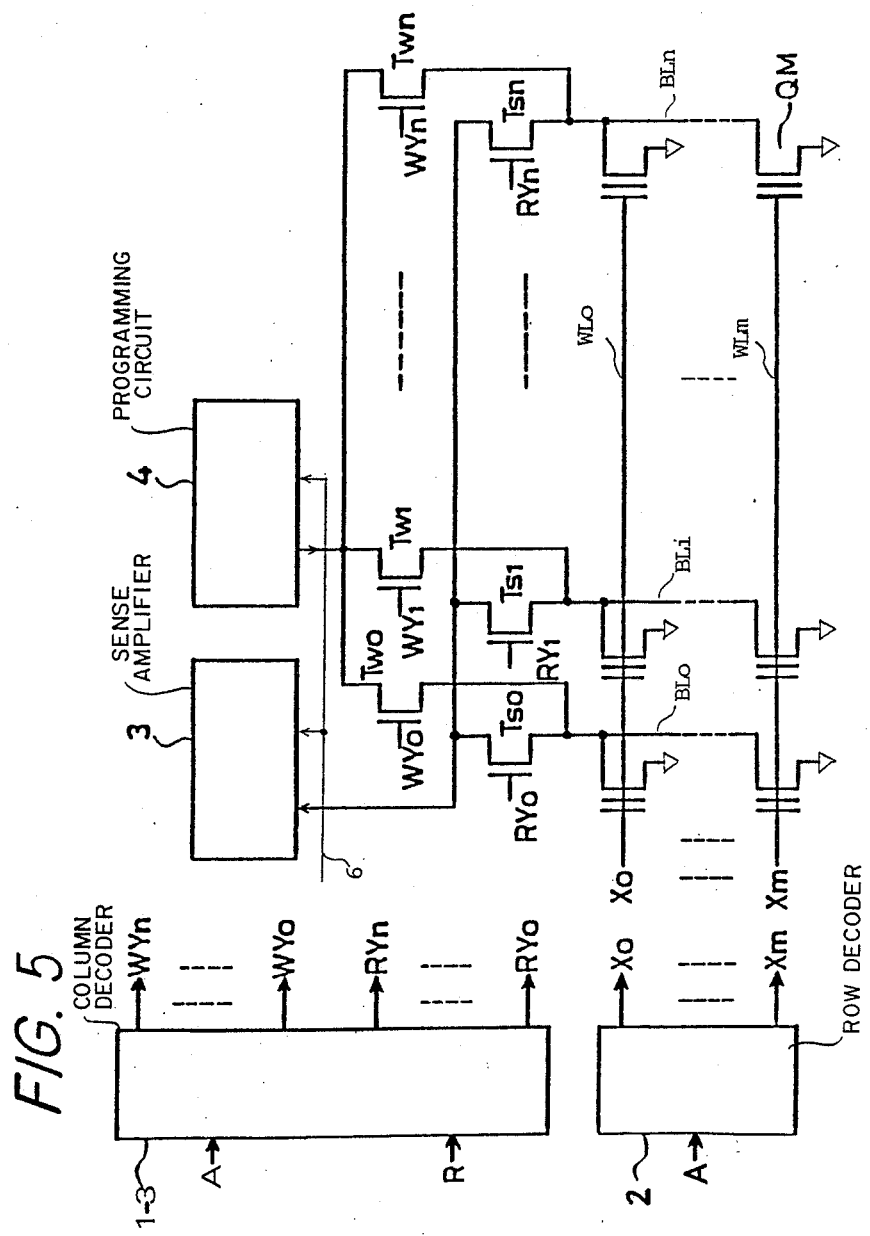
FIG. 5 is a schematic diagram of a memory device secondly embodying the present invention.
Figure 6:
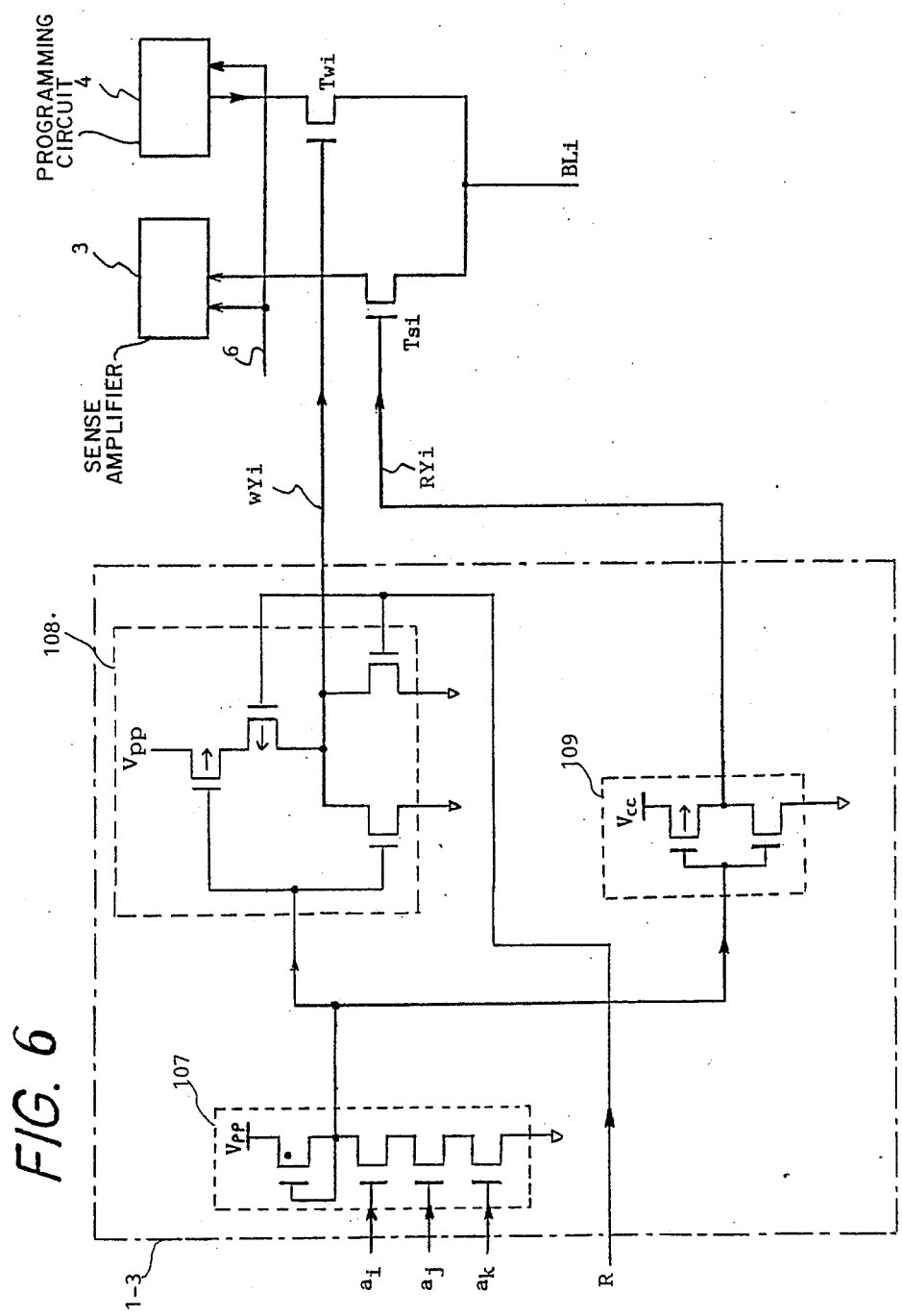
FIG. 6 is a schematic diagram showing a part relating to a column decoder and a column transfer gate transistor of the memory device secondly embodying the present invention.

FIG. 5 is a schematic diagram of a memory device secondly embodying the present invention. In FIG. 5, the same reference numerals or symbol as in FIG. 3 designates the same element or unit as in FIG. 3. FIG. 6 is a schematic diagram showing a part relating to a column decoder 1-3 and the first and the second column transfer gate transistors $T_{Wi}$ and $T_{Si}$ shown in FIG. 5. In FIG. 6, the same reference numeral or symbol as in FIG. 4 designates the same element or unit as in FIG. 4. In the second embodiment, the column decoder 1-3 consists of a NAND gate 107, a switching buffer inverter 108, and a buffer inverter 109 as shown in FIG. 6. Thus, in the second embodiment, there is only one NAND gate, which is a point different from the first embodiment having two NAND gates. When the address designated by the address signal A consisting of the signals $a_i$, $a_j$, and $a_k$ coincides with the address of the selecting PROM cell placed on the bit-line $BL_i$ and the memory device is in the programming mode, the output of the NAND gate 107 becomes an L level, and a read signal R is in an L level, so that the output of the switching buffer inverter 108, which is equal to a write column selecting signal $WY_i$, becomes an H level, which allows to make the first column transfer gate transistor $T_{Wi}$ conductive. In the above condition, similarly to the first embodiment, the second column transfer gate transistor $T_{Si}$ also becomes conductive. However, only the programming circuit 4 operates because of the read-write selecting signal 6. When the address signal A designates the address of the selecting PROM cell and the memory device is in the reading mode, the level of the read signal R becomes equal to the $V_{pp}$ level, so that the write column selecting signal $WY_i$ becomes an L signal, which makes the first column transfer gate transistor $T_{Wi}$ non-conductive and only the second column transfer gate transistor $T_{Si}$ is conductive.

In the first and the second embodiments stated above, as the column transfer gate transistor of the prior art is separated into the first and the second column transfer gate transistors $T_{Wi}$ and $T_{Si}$, the second column transfer gate transistor $T_{Si}$ can be made in a narrow channel width because the transistor $T_{Si}$ requires only a little current to transfer the data signal from the selected PROM cell to the sense amplifier 3. Therefore, the load for the sensing amplifier 3 becomes drastically lighter than that in the prior art. Accordingly, the data sensing speed becomes very fast. Furthermore, for the column decoder 1-2 or 1-3, the load capacitor becomes light, so that both of the rise-time and the fall-time of the read column selecting signal $RY_i$ are shorter than those of the column selecting signals of the prior art.

Concretely explaining the above, the stray capacitance of the second column transfer gate transistor $T_{S0}$, $T_{S1}$, or $T_{Sn}$ becomes approximately one eighth of the first column transfer gate transistor $T_{W0}$, $T_{W1}$, or $T_{Wn}$. Therefore, the memory access time is improved to 120 nanoseconds (n-sec) from 150 n-sec which is the time required in the prior art. Incidentally, a current flowing through the second column transfer gate transistor is 100 microamperes. Whereas, a current flowing through the first column transfer gate transistor is several milliamperes. Since the column transfer gate transistors $T_0$ through $T_n$ of the prior art are separated into two groups in the present invention, the size of the memory device chip increases a little. However, in the first embodiment for example, the increasing ratio is several percent compared with the prior art. The value of several percent is small compared with twenty percent of the improved ratio of the access time.

We claim:

1. A semiconductor memory device into which an externally generated datum is programmed by an externally generated programming address signal when said memory device is in a programming mode, and from which a datum, stored in said memory device, is read out by an externally generated reading address signal when said memory device is in a reading mode, said memory device comprising:
    a plurality of word-lines;
    a plurality of bit-lines extending across said word-lines to form a plurality of intersection points;
    a plurality of memory cells formed at said intersection points;
    a column decoder means for providing a first column selecting signal in response to said programming address signal when said memory device is in said programming mode, and for providing a second column selecting signal in response to said reading address signal when said memory device is in said reading mode;
    a programming circuit for providing a selected memory cell with a data signal corresponding to said externally generated datum when said memory device is in said programming mode;
    a sense amplifier for amplifying a data signal obtained from said datum read out from a selected memory cell when said memory device is in said reading mode;
    a plurality of metal-oxide semiconductor (MOS) first column transfer gate transistors connected between said programming circuit and said plurality of bit lines, respectively, for selectively connecting a selected bit-line to said programming circuit in response to said first column selecting signal during said programming mode, said first column transfer gate transistors being made non-conductive during said reading mode; and
    a plurality of metal-oxide semiconductor (MOS) second column transfer gate transistors connected between said sense amplifier and said plurality of bit lines, respectively, for selectively connecting a selected bit-line to said sense amplifier in response to said second column selecting signal during said reading mode, wherein the current carrying capacity of each of said first column transfer gate transistors is greater than that of each corresponding second column transfer gate transistor.

2. The semiconductor memory device according to claim 1, wherein said first column transfer gate transistor has a drain connected to said bit-line, a source connected to said programming circuit, and a gate connected to said column decoder means.

3. The semiconductor memory device according to claim 1 or 2, wherein said second column transfer gate transistor has a drain connected to said bit-line, a source connected to said sensing amplifier, and a gate connected to said column decoder means.

4. The semiconductor memory device according to claim 1, wherein said decoding means comprises:
    a plurality of first decoders, each for selecting one of said bit lines, such that one of said first decoders outputs a selection signal to a corresponding one of said first column transfer gate transistors, in response to being selected by an address signal when the memory device is in the programming mode; and
    a plurality of second decoders, each for selecting one of said bit lines, such that one of said second decoders outputs a selection signal to a corresponding one of said second column transfer gate transistors, in response to being selected by an address signal when the memory device is in the reading mode.

5. The semiconductor memory device according to claim 1, wherein said decoding means comprises:
a plurality of decoders, each for selecting one of said bit lines, each of said decoders having an output terminal for outputting a selection signal to a corresponding one of said first and a corresponding one of said second column transfer gate transistors in response to being selected by an address signal; and
a plurality of switching buffer inverters, each connected between one of said decoders and a corresponding one of first column transfer gate transistors, for switching off all of said first transfer gate transistors in order to isolate the selected bit line from said programming circuit in the reading mode.

* * * * *

UNITED STATES PATENT AND TRADEMARK OFFICE
CERTIFICATE OF CORRECTION

PATENT NO. : 4,901,281
DATED : February 13, 1990
INVENTOR(S) : YOSHIDA et al

It is certified that error appears in the above-identified patent and that said Letters Patent is hereby corrected as shown below:

On the cover page, Item [75], "Mitsuo Heguchi" should read

--Mitsuo Higuchi--.

Signed and Sealed this

Twenty-eighth Day of May, 1991

Attest:

HARRY F. MANBECK, JR.

Attesting Officer

Commissioner of Patents and Trademarks